(12) United States Patent
Roy

(10) Patent No.: US 9,053,761 B2
(45) Date of Patent: Jun. 9, 2015

(54) CIRCUIT AND METHOD FOR IMPROVING SENSE AMPLIFIER REACTION TIME IN MEMORY READ OPERATIONS

(71) Applicant: LSI Corporation, Milpitas, CA (US)

(72) Inventor: Rajiv Roy, Uttar Pradesh (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 234 days.

(21) Appl. No.: 13/671,147

(22) Filed: Nov. 7, 2012

(65) Prior Publication Data

US 2014/0126315 A1    May 8, 2014

(51) Int. Cl.
*G11C 7/00*     (2006.01)
*G11C 7/08*     (2006.01)
*G11C 11/419*   (2006.01)
*G11C 7/06*     (2006.01)

(52) U.S. Cl.
CPC .. *G11C 7/08* (2013.01); *G11C 7/06* (2013.01); *G11C 11/419* (2013.01)

(58) Field of Classification Search
USPC .......................................... 365/205, 206, 207
See application file for complete search history.

(56) References Cited

U.S. PATENT DOCUMENTS

| | | | | |
|---|---|---|---|---|
| 5,237,533 | A * | 8/1993 | Papaliolios | 365/145 |
| 6,191,989 | B1 * | 2/2001 | Luk et al. | 365/207 |
| 6,205,072 | B1 * | 3/2001 | Jung | 365/207 |
| 6,282,138 | B1 * | 8/2001 | Wilkins | 365/207 |
| 6,868,024 | B2 * | 3/2005 | Pekny | 365/189.09 |
| 7,391,648 | B2 * | 6/2008 | Pekny | 365/185.2 |
| 7,738,281 | B2 * | 6/2010 | Iida | 365/149 |
| 2001/0003508 | A1 * | 6/2001 | Lee | 365/185.02 |
| 2007/0024325 | A1 * | 2/2007 | Chen | 327/55 |

* cited by examiner

*Primary Examiner* — Pho M Luu
(74) *Attorney, Agent, or Firm* — Sheridan Ross P.C.

(57) ABSTRACT

A sense amplifier circuit, a method of modifying a differential voltage in a sense amplifier circuit and a memory system incorporating the sense amplifier circuit or the method are described. The sense amplifier circuit is described to include: (1) a differential amplifier having first and second inputs respectively couplable to first and second complimentary bit lines and configured to receive a differential voltage therefrom representing a current logic value to be read and (2) a sense speed alteration circuit having first and second outputs respectively coupled to the first and second inputs via respective first and second capacitors and configured to cause one of the first and second capacitors to discharge to increase the differential voltage when a previously read logic value is opposite the current logic value to be read.

21 Claims, 2 Drawing Sheets

CIRCUIT AND METHOD FOR IMPROVING SENSE AMPLIFIER REACTION TIME IN MEMORY READ OPERATIONS

TECHNICAL FIELD

This application is directed, in general, to sense amplifiers and, more specifically, to a sense amplifier having a faster reaction time.

BACKGROUND

Virtually all semiconductor memory integrated circuits require the use of a sense amplifier to output stored data. The sense amplifier is a basic component for sensing the output voltage of a memory cell in response to signals on a bit-line. The sense amplifier senses logic levels representing a one or zero stored in the memory cell and amplifies the small voltage to complimentary metal-oxide semiconductor (CMOS) logical voltage levels.

As CMOS technology tends to become smaller, more dense, and faster over time, improvements in high-speed processor design have outpaced those of semiconductor memory, creating a bottleneck with respect to overall integrated circuit speed. As a result, CMOS technology development is experiencing diminishing returns and will continue down that path until memory speeds catch up to processing speeds.

Semiconductor memory designs are constrained by concerns over power consumption, reliability, and, of course, time. Read and write cycle times define a memory chip's speed. Specifically, read times are largely dictated by the speed at which the sense amplifier operates to provide CMOS level data. In the case of a double-ended differential sense amplifier, the latency of the sense amplifier rides on the speed at which it can recognize a voltage differential.

The general rule is that as voltage differential increases, the amplifier's reaction time decreases. The boundary on this rule is that while larger voltage differentials are achievable, yielding faster sense amplifier reaction, the voltages take longer to discharge. Once discharged, additional power is then required to recharge the circuit. Sense amplifiers are designed to strike a balance among sense amplifier reaction time, discharge time and power consumption.

SUMMARY

One aspect provides a sense amplifier circuit. In one embodiment, the sense amplifier circuit includes: (1) a differential amplifier having first and second inputs respectively couplable to first and second complimentary bit lines and configured to receive a differential voltage therefrom representing a current logic value to be read and (2) a sense speed alteration circuit having first and second outputs respectively coupled to the first and second inputs via respective first and second capacitors and configured to cause one of the first and second capacitors to discharge to increase the differential voltage when a previously read logic value is opposite the current logic value to be read.

Another aspect provides a method of modifying a differential voltage in a sense amplifier circuit. In one embodiment, the method includes: (1) charging first and second capacitors coupled to respective first and second inputs of a differential amplifier, (2) employing a memory cell containing a current logic value to be read to discharge one of the first and second complimentary bit-lines coupled respectively between the memory cell and the first and second inputs and (3) discharging one of the pair of capacitors according to a previously read logic value to: (3a) decrease the differential voltage present across the input terminals of the differential amplifier when the previously read logic value is equivalent to the current logic value to be read and (3b) increase the differential voltage present across the input terminals of the differential amplifier when the previously read logic value is opposite the current logic value to be read.

Yet another aspect provides a memory system. In one embodiment, the memory system includes: (1) an array of memory cells, (2) an addressing circuit configured to activate a memory cell of the array of memory cells and associated with a specified memory address and (3) a sense amplifier circuit, including: (3a) a differential amplifier having first and second inputs respectively couplable to first and second complimentary bit lines and configured to receive a differential voltage therefrom representing a current logic value to be read and (3b) a sense speed alteration circuit having first and second outputs respectively coupled to the first and second inputs via respective first and second transistors and configured to cause one of the first and second transistors to discharge to increase the differential voltage when a previously read logic value is opposite the current logic value to be read.

BRIEF DESCRIPTION

Reference is now made to the following descriptions taken in conjunction with the accompanying drawings, in which.

DETAILED DESCRIPTION

Before describing various embodiments of the circuit or method introduced herein, semiconductor memory architecture and operation will be generally described.

Semiconductor memory stores data in circuits called memory cells, each cell having a one-bit capacity. The cells are arranged in rows and columns forming what are known as memory cell arrays. A memory cell array is accessible by a mesh of wires known as bit-lines and word-lines. The word-lines run along the rows of memory cells, each line connecting to each cell in the row. The bit-lines run along the columns of memory cells, each line connecting to each cell in the column. Access to a memory cell is had by activating or addressing one bit-line and one word-line, allowing data to be read or written to the cell. Alternatively, bit-lines may be implemented in complementary pairs allowing the memory to operate according to differential voltages rather than single-ended voltages. Sense amplifiers are located at the ends of bit lines, on the edges of the memory cell array. When the memory cell is addressed, the sense amplifier at the end of the addressed bit-line amplifies the small voltage (alternatively a small voltage differential) generated by the cell to a CMOS voltage level, or logic level. The logic level, representing a bit of data, is then transmitted from the memory circuit.

It is fundamentally realized herein that the read cycle time of a semiconductor memory integrated circuit employing a double-ended differential sense amplifier circuit may be improved by increasing the voltage differential at the input stage of the amplifier without suffering substantial increased power consumption or discharge times. The boundary formerly constraining sense amplifier circuits may be avoided by a capacitive coupling of a previous data read. It is realized herein that, when data is to be read, the capacitive coupling operates to decrease the voltage on one of the two input terminals of the amplifier. Depending on the data being read (one or zero) and the immediately preceding data read (one or zero), the voltage differential either increases or decreases. It is further realized herein the voltage differential and sense amplifier reaction time is of no consequence when the data being read logically matches (zero-zero or one-one) the preceding data read. It is realized herein the capacitive coupling may be controlled via a sense speed alteration circuit such that an increased voltage differential aligns with an opposite data read (zero-one or one-zero), thus decreasing the sense amplifier reaction time, and a decreased voltage differential aligns with a matching data read (zero-zero or one-one), thus slowing the amplifier reaction time.

It is also realized herein that the capacitive coupling's increasing of the voltage differential at the time of the sensing, no additional power is necessary to increase the differential and the bit-lines require no further discharging.

Figure 1:
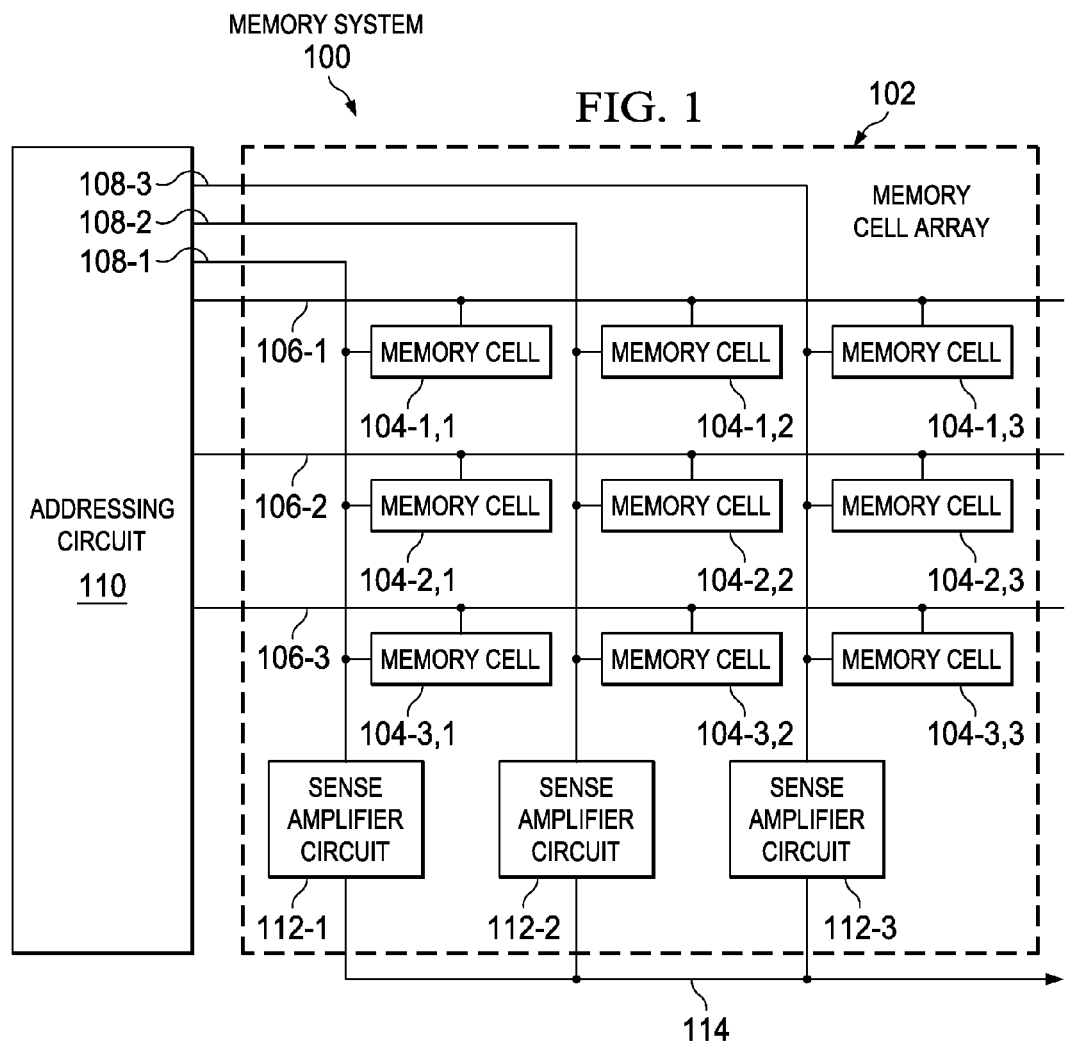
FIG. 1 is a block diagram of one embodiment of a semiconductor memory integrated circuit.

FIG. 1 is a block diagram of one embodiment of a memory system 100 in which one or more aspects of the invention may be implemented. The memory system 100 includes a memory cell array 102 and an addressing circuit 110. The memory cell array 102 is arranged in rows and columns of memory cells 104. The embodiment of FIG. 1 illustrates a three-by-three array of memory cells. Alternative embodiments may use any number of rows and columns of memory cells. The size of an array is dependent on its application and may range from hundreds of memory cells to many millions. For instance, a 64 kilobyte array has 524,288 memory cells. A one gigabyte array has over eight billion memory cells. In the embodiment of FIG. 1, each memory cell 104 in a row is electrically connected to a word-line 106 for the row. For example, in the first row of memory cells 104-1, each memory cell 104-1,1, 104-1,2 and 104-1,3, is electrically connected to word-line 106-1. Furthermore, each memory cell 104 in a column is electrically connected to a bit-line 108 for the column. For example, in the first column of memory cells, 108-1, each memory cell 104-1,1, 104-2,1 and 104-3,1 is electrically connected to bit-line 108-1. In certain embodiments, the bit-line 108 is actually a complimentary pair of bit-lines that provides for use of differential voltages.

In the embodiment of FIG. 1, each bit-line drives a sense amplifier circuit 112. The sense amplifier circuit 112 serves the entire column of memory cells 104 by discriminating low level voltages generated by the memory cells 104 and outputting a CMOS logic level voltage representing a bit to be read from the memory cell array 102.

Access is had to a memory cell 104-n,m via the addressing circuit 110. A read cycle begins by the addressing circuit 110 pre-charging the appropriate word-line 106-n and bit-line 108-m corresponding to the memory cell 104-n,m to be read, thus activating the memory cell 104-n,m. The memory cell 104-n,m then discharges the bit-line 108-m to reflect a stored logic value, which is then amplified by the sense amplifier circuit 112-m. The amplified logic value is output from the memory system 100 on an output line 114.

Figure 2:
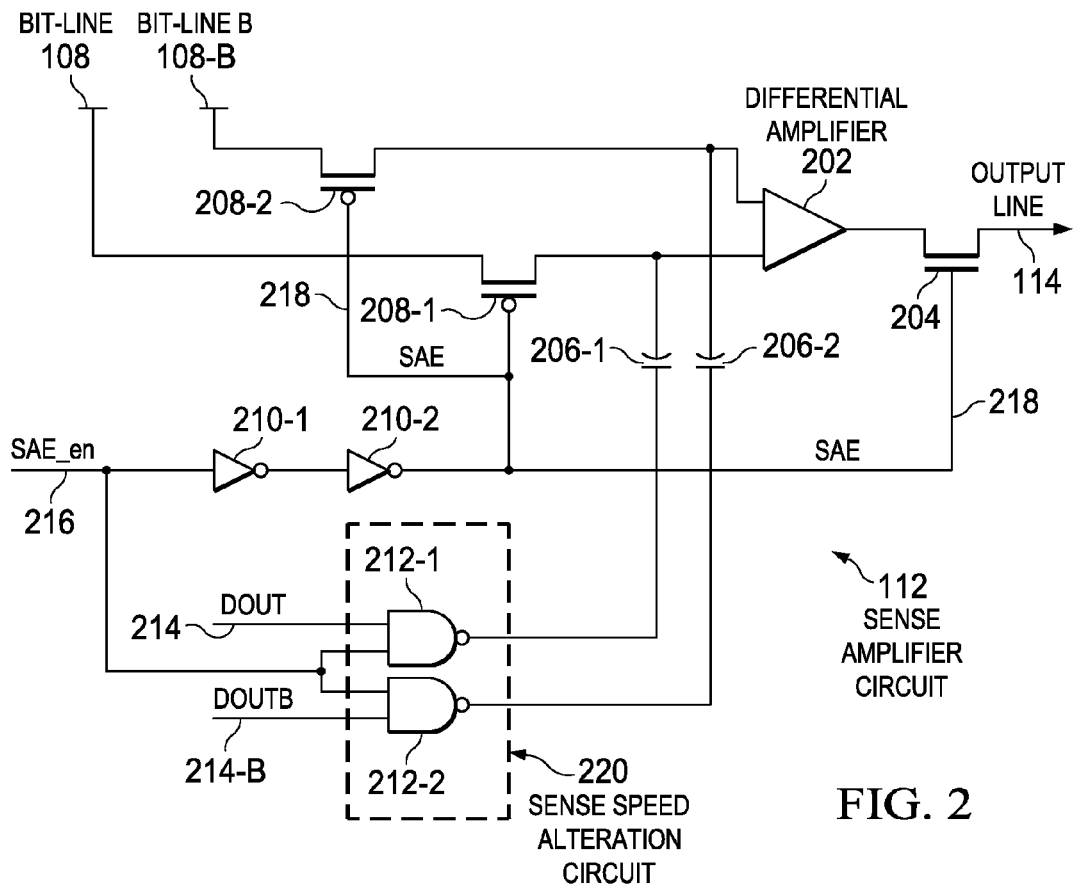
FIG. 2 is a diagram of one embodiment of a sense amplifier circuit configured to alter the voltage differential at input stage of a differential amplifier.

FIG. 2 is a diagram of one embodiment of the sense amplifier circuit 112 of FIG. 1 in which one aspect of the invention is implemented. The sense amplifier circuit 112 employs a differential amplifier 202 and is therefore configured with a pair of complimentary bit-lines: bit-line 108 and bit-line B 108-B. The bit-lines 108 and 108-B are configured such that during read cycles, when bit-line 108 is driven at a logic-high voltage, bit-line B 108-B is driven at a logic-low voltage, and vice versa. The bit-lines 108 and 108-B are configured to drive an input stage of the differential amplifier 202 through two FET devices 208-1 and 208-2. An output stage of the differential amplifier 202 is configured to drive the output line 114 of FIG. 1 through another FET device 204. The FET devices 208-1, 208-2 and 204 are configured for control by a buffered sense amplifier enable signal or SAE 218. The sense amplifier circuit is configured to generate the buffered SAE signal 218 by driving an un-buffered SAE_en signal 216 through a series of buffer devices 210-1 and 210-2. Control of the input stage FETs 208-1 and 208-2 is configured to be inverted from that of the output stage FET 204. For example, when the buffered SAE signal 218 is driven at a logic-low voltage, the input stage FETs 208-1 and 208-2 are closed circuits, thus driving the differential amplifier 202, and the output stage FET 204 is open. Likewise, when the buffered SAE signal 218 is driven at a logic-high voltage, the input stage FETs 208-1 and 208-2 open and the output stage FET 204 closes, thus driving the output line 114.

Coupled to the input stage of the differential amplifier 202 are two capacitors 206-1 and 206-2. In certain embodiments the capacitors 206-1 and 206-2 are equivalent in capacitance. Other embodiments employ MOS capacitors.

In the embodiment of FIG. 2 the capacitors 206-1 and 206-2 are each coupled to outputs of a sense speed alteration circuit 220 containing two NAND gates 212-1 and 212-2. The sense speed alteration circuit 220 is configured to be driven by a previous memory output DOUT 214 and its compliment DOUTB 214-B. The sense speed alteration circuit 220 is also configured to be driven by the un-buffered SAE_en signal 216.

The sense amplifier circuit 112 of FIG. 2 is configured to output, after a time delay, a CMOS logic-high voltage if the voltage differential at the input stage of the differential amplifier 202 is such that bit-line 108 is driven at a higher voltage than bit-line B 108-B (i.e., $V_{BitLine} > V_{BitLineB}$). If the voltage differential at the input stage is the opposite, such that bit-line B 108-B is driven at a higher voltage, then the sense amplifier circuit 112 is configured to output, again, after a time delay, a CMOS logic-low voltage.

The sense amplifier circuit 112 is further configured to speed the reaction time of the differential amplifier 202 by an increased voltage differential at the input stage of the differential amplifier 202, thus reducing the time delay from initiating a read cycle to outputting a CMOS level voltage. The increased voltage differential is configured to occur when, on two consecutive read cycles retrieving a first and second logic value, the first logic value read from memory is opposite the second logic value read from memory. Otherwise, the sense amplifier circuit 112 is configured to decrease the voltage differential.

The sense amplifier circuit 112 is configured to generate the increased voltage differential at the input stage of the differential amplifier 202 by a voltage drop over the capacitor (either capacitor 206-1 or 206-2) coupled to the bit-line being driven at the lower voltage, that being bit-line 108 when reading a logic-low and bit-line B 108-B when reading a logic-high.

The sense speed alteration circuit 220 is configured to generate the voltage drop over either capacitor 206-1 or 206-2 by driving its two logic outputs, each output being coupled to one of the capacitors 206-1 and 206-2. Again, on two consecutive read cycles, if the first or previous logic value read from memory is logic-low or zero and the second or current is logic-high or one, then the voltage differential at the input stage of the differential amplifier is such that bit-line 108 is driven at a higher voltage than bit-line B 108-B. The two outputs of the sense speed alteration circuit 220 are configured to be driven high initially, as the un-buffered SAE_en signal 216 is initially low. As stated above, the previous logic value read is logic-low; therefore the other inputs to the sense speed alteration circuit 220, DOUT 214 and DOUTB 214-B, are logic-low and logic-high respectively.

When the SAE_en signal 216 is driven high for the second read cycle, the sense speed alteration circuit output coupled to DOUTB 214-B is configured to swing from high to low, causing the capacitor 206-2 to discharge back through the sense speed alteration circuit 220. The sense amplifier circuit 112 is configured such that when the capacitor 206-2 discharges in the above scenario, a voltage drop is seen on bit-line B 108-B, increasing the voltage differential at the input stage of the differential amplifier 202. The sense amplifier circuit 112 is further configured such that after the discharge of capacitor 206-2 and the increasing of the voltage differential, the buffered SAE signal 218 swings from low to high, opening the FET devices 208-1 and 208-2 and closing FET device 204, which decouples bit-lines 108 and 108-B and drives the output line 114 with the amplified CMOS voltage level.

Similarly, if in the two consecutive read cycles, the first or previous logic value read is a one and the second or current logic value to be read is a zero, then the sense speed alteration circuit 220 is configured to cause the discharge of capacitor 206-1 on the low-to-high swing of the SAE_en signal 216. The discharge of capacitor 206-1 creates a voltage drop on bit-line 108, which, in this scenario, is driven at a lower voltage than bit-line B 108-B. Again, the sense amplifier circuit 112 is configured to increase the voltage differential thus decreasing the reaction time of the differential amplifier and the overall time delay of the read cycle. Again, the sense amplifier circuit 112 is configured such that the low-to-high voltage swing of SAE signal 218 changes the states of FET devices 208-1, 208-2 and 204, decouples the bit-lines 108 and 108-B, and drives the output line 114.

Figure 3:
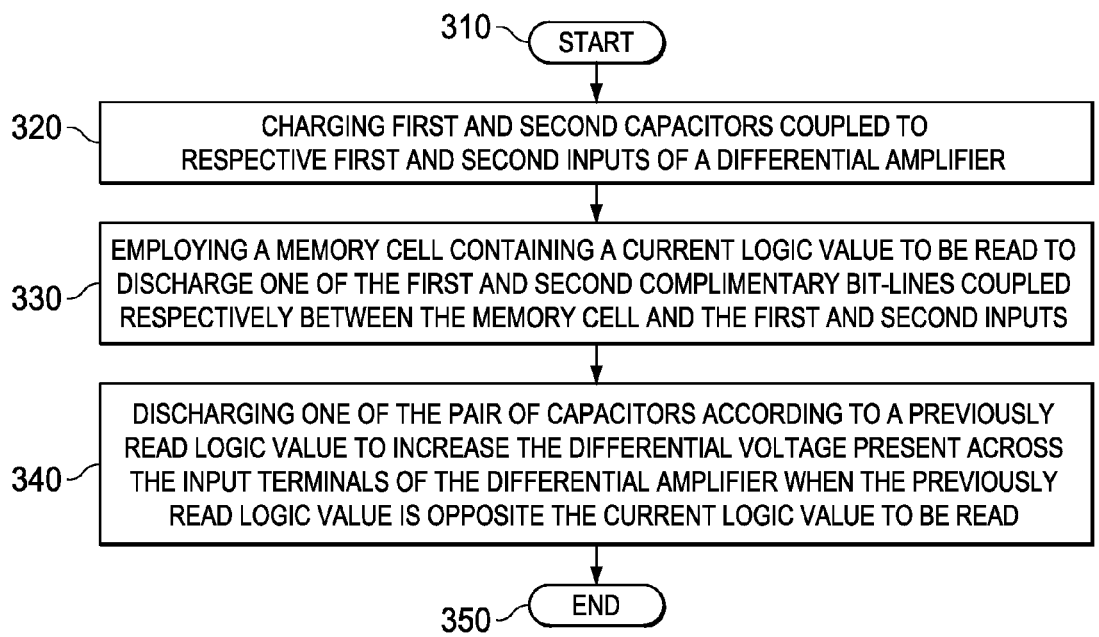
FIG. 3 is a flow diagram of a method of modifying a differential voltage in a sense amplifier circuit.

FIG. 3 is a method for modifying a differential voltage in a sense amplifier circuit. The method begins at a start step 310. A pair of capacitors is charged at step 320, each of the capacitors being coupled to one of a pair of complimentary bit-lines. A current logic value to be read is employed at step 330 to discharge one of the pair of complimentary bit-lines, each of the bit-lines being coupled to an input terminal of a differential amplifier, and also to a memory cell containing the current logic value. In alternative embodiments, the charging of the bit-lines is preceded by a coupling step, where the bit-lines are coupled to the differential amplifier on a logic-low SAE control signal, and decoupled on a logic-high SAE control signal.

Continuing the method of FIG. 3, at step 340, one of the capacitors is discharged, the determination of which capacitor being made according to a previously read out logic value. The discharging of step 340 causes a voltage drop at one of the input terminals of the differential amplifier, increasing the differential voltage when the previously read logic value is opposite the current logic value. The method then ends at step 350.

In alternative embodiments, the determination of which capacitor to discharge is made by a sense speed alteration circuit driven by the previously read out logic value and, in certain embodiments, an SAE_en signal, the SAE_en signal being an un-buffered version of the SAE control signal mentioned above. The sense speed alteration circuit causes the discharge of one of the capacitors by dropping the voltage at one of two sense speed alteration circuit output terminals from a logic-high to a logic-low voltage. The two output terminals of the sense speed alteration circuit are coupled to the two capacitors, those capacitors being coupled to the bit-lines.

In other embodiments, a distinction is made as to whether the current logic value to be read matches the previously read out logic value. If the two logic values match, the capacitor discharged is such that it decreases the differential voltage at the input stage of the differential amplifier. If the two logic values are opposite, the capacitor discharged is such that it increases the differential voltage at the input stage of the differential amplifier. In other embodiments the output of the differential amplifier is switched by a FET device configured to couple the output line on a logic-high SAE signal and to decouple the output line otherwise.

Those skilled in the art to which this application relates will appreciate that other and further additions, deletions, substitutions and modifications may be made to the described embodiments.

What is claimed is:

1. A sense amplifier circuit, comprising:
 a differential amplifier having first and second inputs respectively couplable to first and second complimentary bit lines and configured to receive a differential voltage therefrom representing a current logic value to be read; and
 a sense speed alteration circuit having first and second outputs respectively coupled to said first and second inputs via respective first and second capacitors and configured to cause one of said first and second capacitors to discharge to increase said differential voltage across said inputs of said differential amplifier when a previously read logic value is opposite said current logic value to be read.

2. The sense amplifier circuit as recited in claim 1 wherein said sense speed alteration circuit is configured to employ a sense amplifier enable signal in causing said one of said first and second capacitors to discharge.

3. The sense amplifier circuit as recited in claim 2 wherein an output of said differential amplifier is coupled to a switch controlled by a signal based on said sense amplifier enable signal.

4. The sense amplifier circuit as recited in claim 2 wherein said first and second inputs are couplable to said first and second complimentary bit-lines via first and second switches, said first and second switches controlled by a signal based on said sense amplifier enable signal.

5. The sense amplifier circuit as recited in claim 2 wherein said sense speed alteration circuit includes:
 a first NAND gate configured to employ said sense amplifier enable signal and said previously read logic value to provide said first output; and
 a second NAND gate configured to employ said sense amplifier enable signal and a logical inverse of said previously read logic value.

6. The sense amplifier circuit as recited in claim 1 wherein said first and second capacitors are substantially equal in capacitance.

7. The sense amplifier circuit as recited in claim 1 wherein said first and second capacitors are embodied in MOS capacitors.

8. A method of modifying a differential voltage in a sense amplifier circuit, comprising:
 charging first and second capacitors coupled to respective first and second inputs of a differential amplifier;
 employing a memory cell containing a current logic value to be read to discharge one of the first and second complimentary bit-lines coupled respectively between said memory cell and said first and second inputs; and discharging one of said pair of capacitors according to a previously read logic value to increase said differential voltage present across said input terminals of said differential amplifier when said previously read logic value is opposite said current logic value to be read.

9. The method as recited in claim 8 wherein said discharging comprises employing a sense amplifier enable signal.

10. The method as recited in claim 9 further comprising employing a signal based on said sense amplifier enable signal to control a switch coupled to an output of said differential amplifier.

11. The method as recited in claim 9 wherein said first and second inputs are couplable to said first and second complimentary bit-lines via first and second switches, said first and second switches, said method further comprising employing a signal based on said sense amplifier enable signal to control said switch.

12. The method as recited in claim 9 further comprising:
employing said sense amplifier enable signal and said previously read logic value to provide said first output; and
employing said sense amplifier enable signal and a logical inverse of said previously read logic value.

13. The method as recited in claim 8 wherein said first and second capacitors are substantially equal in capacitance.

14. The method as recited in claim 8 wherein said first and second capacitors are embodied in MOS capacitors.

15. A memory system, comprising:
an array of memory cells;
an addressing circuit configured to activate a memory cell of said array of memory cells and associated with a specified memory address; and
a sense amplifier circuit, including:
a differential amplifier having first and second inputs respectively couplable to first and second complimentary bit lines and configured to receive a differential voltage therefrom representing a current logic value to be read, and
a sense speed alteration circuit having first and second outputs respectively coupled to said first and second inputs via respective first and second transistors and configured to cause one of said first and second transistors to discharge to increase said differential voltage when a previously read logic value is opposite said current logic value to be read.

16. The memory system as recited in claim 15 wherein said sense speed alteration circuit is configured to employ a sense amplifier enable signal in causing said one of said first and second transistors to discharge.

17. The memory system as recited in claim 16 wherein an output of said differential amplifier is coupled to a switch controlled by a signal based on said sense amplifier enable signal.

18. The memory system as recited in claim 16 wherein said first and second inputs are couplable to said first and second complimentary bit-lines via first and second switches, said first and second switches controlled by a signal based on said sense amplifier enable signal.

19. The memory system as recited in claim 16 wherein said sense speed alteration circuit includes:
a first NAND gate configured to employ said sense amplifier enable signal and said previously read logic value to provide said first output; and
a second NAND gate configured to employ said sense amplifier enable signal and a logical inverse of said previously read logic value.

20. The memory system as recited in claim 15 wherein said first and second transistors are substantially equal in capacitance.

21. A sense amplifier circuit, comprising:
a differential amplifier having first and second inputs respectively couplable to first and second complimentary bit lines and configured to receive a differential voltage therefrom representing a current logic value to be read; and
a sense speed alteration circuit having first and second outputs respectively coupled to said first and second inputs via respective first and second transistors and configured to cause one of said first and second transistors to discharge to increase said differential voltage across said inputs of said differential amplifier when a previously read logic value is opposite said current logic value to be read.

* * * * *